US012411533B2

(12) United States Patent
Bang et al.

(10) Patent No.: US 12,411,533 B2
(45) Date of Patent: Sep. 9, 2025

(54) ELECTRONIC DEVICE AND CONTROLLING METHOD THEREFOR

(71) Applicant: SAMSUNG ELECTRONICS CO., LTD., Suwon-si (KR)

(72) Inventors: Sungyong Bang, Suwon-si (KR); Sangmin Lee, Suwon-si (KR); Sunghun Jung, Suwon-si (KR); Jongwoo Kim, Suwon-si (KR); Hakryoul Kim, Suwon-si (KR); Mooyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 18/108,419

(22) Filed: Feb. 10, 2023

(65) Prior Publication Data

US 2023/0189470 A1 Jun. 15, 2023

Related U.S. Application Data

(63) Continuation of application No. PCT/KR2021/008034, filed on Jun. 25, 2021.

(30) Foreign Application Priority Data

Aug. 11, 2020 (KR) ........................ 10-2020-0100624

(51) Int. Cl.
   *G06F 1/20* (2006.01)
   *G05B 19/4155* (2006.01)
   *H05K 7/20* (2006.01)

(52) U.S. Cl.
   CPC ......... *G06F 1/206* (2013.01); *G05B 19/4155* (2013.01); *H05K 7/20* (2013.01); *G05B 2219/50333* (2013.01)

(58) Field of Classification Search
   CPC .......... H05K 7/20; G06F 1/206; G06N 20/00; G06N 20/10
   See application file for complete search history.

(56) References Cited

U.S. PATENT DOCUMENTS

| 8,452,463 B2 | 5/2013 | Cox et al. |
| 9,966,783 B2 | 5/2018 | Sacchetti et al. |
| 10,025,329 B2 | 7/2018 | Slaby et al. |
| 10,126,794 B2 | 11/2018 | Bang et al. |

(Continued)

FOREIGN PATENT DOCUMENTS

| CN | 102045447 A | 5/2011 |
| CN | 106774733 A | 5/2017 |

(Continued)

OTHER PUBLICATIONS

Communication dated Nov. 7, 2024, issued by the Korean Patent Office in Korean Application No. 10-2020-0100624.

(Continued)

*Primary Examiner* — Mong-Shune Chung
(74) *Attorney, Agent, or Firm* — Sughrue Mion, PLLC

(57) ABSTRACT

An electronic device includes a sensor, a communication circuit, and a processor configured to learn a scenario based on use of the electronic device in a first temperature range, determine, using the communication circuit and/or the sensor, whether a place element of the electronic device is changed, start the scenario based on determining that the place element is changed, estimate an ambient temperature of the electronic device based on the scenario, and enter a second heating control mode at a second temperature different from a first heating control mode at a first temperature, based on the estimated ambient temperature being different from an internal temperature of the electronic device.

20 Claims, 8 Drawing Sheets

(56) References Cited

U.S. PATENT DOCUMENTS

| | | |
|---|---|---|
| 10,197,457 B2 | 2/2019 | Jang et al. |
| 11,228,986 B2 | 1/2022 | Lee et al. |
| 11,366,486 B2 | 6/2022 | Jung et al. |
| 2014/0163765 A1 | 6/2014 | Jain et al. |
| 2014/0240031 A1 | 8/2014 | Vadakkanmaruveedu et al. |
| 2015/0220097 A1 | 8/2015 | Kwong et al. |
| 2015/0349570 A1 | 12/2015 | Niederberger et al. |
| 2016/0062326 A1 | 3/2016 | Bang et al. |
| 2016/0069753 A1* | 3/2016 | Phan Le ............ H04M 1/0202 702/130 |
| 2016/0116952 A1* | 4/2016 | Lee ..................... G06F 3/0346 700/299 |
| 2020/0301487 A1* | 9/2020 | Bamba ............... G05D 23/1917 |
| 2021/0240165 A1 | 8/2021 | Noh et al. |
| 2021/0255746 A1* | 8/2021 | Hu ....................... G06F 1/3203 |
| 2022/0141777 A1 | 5/2022 | Lee et al. |

FOREIGN PATENT DOCUMENTS

| | | |
|---|---|---|
| CN | 107229521 A | 10/2017 |
| KR | 10-2016-0026329 A | 3/2016 |
| KR | 10-2016-0049671 A | 5/2016 |
| KR | 10-2016-0145999 A | 12/2016 |
| KR | 10-1833601 B1 | 2/2018 |
| KR | 10-1843998 B1 | 5/2018 |
| KR | 10-2018-0088776 A | 8/2018 |
| KR | 10-1909950 B1 | 10/2018 |
| KR | 10-2019-0127306 A | 11/2019 |
| KR | 10-2045290 B1 | 11/2019 |
| KR | 10-2020-0017260 A | 2/2020 |
| KR | 10-2020-0132161 A | 11/2020 |

OTHER PUBLICATIONS

Communication dated Oct. 1, 2021, issued by the International Searching Authority in counterpart International Application No. PCT/KR2021/008034 (PCT/ISA/210).

Communication dated Oct. 1, 2021, issued by the International Searching Authority in counterpart International Application No. PCT/KR2021/008034 (PCT/ISA/237).

* cited by examiner

| # | Sender Device | Receiver Device | CHARGING | WiFi | Flight |
|---|---|---|---|---|---|
| 1 | VT Call | VT Call | X | X | X |
| 2 | VT Call + Download | VT Call + Download | O | X | X |
| 3 | Game1 | Game1 | O | X | X |
| 4 | Download | Download | O | X | X |
| 5 | RAPID DISCHARGE | RAPID DISCHARGE | X | O | X |
| 6 | CAMERA RECORDING | CAMERA RECORDING | O | X | X |
| 7 | Youtube (LTE/5G) | Youtube (LTE/5G) | X | X | X |
| 8 | Browsing (LTE/5G) | Browsing (LTE/5G) | X | X | X |
| 9 | Game2 | Game2 | O | O | X |
| 10 | App Install + Download | App Install + Download | O | X | X |
| 11 | Benchmark Antutu | Benchmark Antutu | X | X | O |
| 12 | Benchmark geekbench4 | Benchmark geekbench4 | X | X | O |
| 13 | Benchmark GFX | Benchmark GFX | X | X | O |

FIG. 5

ELECTRONIC DEVICE AND CONTROLLING METHOD THEREFOR

CROSS-REFERENCE TO RELATED APPLICATIONS

This application is a bypass continuation of International Application No. PCT/KR2021/008034, filed on Jun. 25, 2021, in the Korean Intellectual Property Receiving Office, which is based on and claims priority to Korean Patent Application No. 10-2020-0100624, filed on Aug. 11, 2020, in the Korean Intellectual Property Office, the disclosures of which are incorporated herein by reference in their entireties.

BACKGROUND

1. Field

The disclosure relates to an electronic device and a control method thereof.

2. Description of Related Art

An electronic device may operate using its internal components. The components of the electronic device may operate in any one of a normal mode for operating at normal performance and a heating control mode for operating at performance lower than the normal performance such that heat generated from the internal components is reduced. The electronic device may include a temperature sensor which measures its internal temperature. When the temperature measured by the temperature sensor is greater than or equal to a specified heating control entry temperature, the electronic device may enter the heating control mode.

It may not easy to determine (i.e., measure, estimate, etc.) an ambient temperature of an electronic device using a temperature sensor. The electronic device measures an internal temperature of the electronic device and may collectively operate in a heating control mode, when the internal temperature of the electronic device is greater than or equal to a heating control entry temperature.

When the ambient temperature of the electronic device has a value out of a room temperature range, a time point for entering the heating control mode may be changed. For example, when the ambient temperature of the electronic device is higher than the room temperature range, the internal temperature of the electronic device may be raised by an external influence. Even when heat does not occur from components in the electronic device, the internal temperature of the electronic device may be greater than or equal to the heating control entry temperature. In this case, as the electronic device enters the heating control mode too quickly, the components in the electronic device may operate at low performance. As another example, when the ambient temperature of the electronic device is lower than the room temperature range, the internal temperature of the electronic device may be lowered by an external influence. In this case, as the electronic device enters the heating control mode too slowly, heat generated by the electronic device may cause discomfort in use.

SUMMARY

Provided are a method for estimating an ambient temperature of the electronic device and controlling a heating control entry temperature based on the estimated ambient temperature and an electronic device applying the method.

Additional aspects will be set forth in part in the description which follows and, in part, will be apparent from the description, or may be learned by practice of the presented embodiments.

According to an aspect of the disclosure, an electronic device may include, a sensor, a communication circuit, and a processor configured to learn a scenario based on use of the electronic device in a first temperature range, determine, using the communication circuit and/or the sensor, whether a place element of the electronic device is changed, start the scenario based on determining that the place element is changed, estimate an ambient temperature of the electronic device based on the scenario, and enter a second heating control mode at a second temperature different from a first heating control mode at a first temperature, based on the estimated ambient temperature being different from an internal temperature of the electronic device.

The scenario may include a plurality of sub-scenarios used by at least one or more of a plurality of components which generate heat in the electronic device.

The processor may be further configured to learn the scenario by acquiring data associated with the internal temperature of the electronic device, data associated with an amount of change in the internal temperature during a specified time, data associated with a current consumption of the electronic device, and/or data associated with a charging current when the electronic device is charged.

The communication circuit may be configured to obtain a plurality of machine learning parameters from a server, and the processor may be further configured to update the scenario based on the plurality of machine learning parameters.

The place element may include a global positioning system (GPS) location, a Wi-Fi signal with which the communication circuit is connected, information of a cell with which the communication circuit is connected, and/or an external illumination measured by the sensor.

The processor may be further configured to determine a current temperature that is increased by use of the electronic device based on a current consumption of the electronic device, where the processor is configured to estimate the ambient temperature based on a value obtained by subtracting the current temperature from the internal temperature.

The processor may be further configured to set the second temperature to a value higher than the first temperature, based on the estimated ambient temperature being higher than the internal temperature.

The processor may be further configured to set the second temperature to a value lower than the first temperature, based on the estimated ambient temperature being lower than the internal temperature.

According to an aspect of the disclosure, a method of an electronic device may include determining an internal temperature of the electronic device based on use of the electronic device, determining an amount of change in the internal temperature of the electronic device during a specified first time, determining a current consumption of the electronic device, learning a scenario, starting the scenario, based on a place element measured by the electronic device being changed, estimating an ambient temperature of the electronic device based on the internal temperature, the amount of change, and the current consumption, and adjusting a heating control entry temperature at which the electronic device enters a heating control mode based on the estimated ambient temperature.

The scenario may include a plurality of sub-scenarios used by at least one or more of a plurality of components which generate heat in the electronic device.

The method may include iteratively obtaining the scenario based on use of the electronic device in a first temperature range.

The place element may include a GPS location, a Wi-Fi signal with which a communication circuit of the electronic device is connected, information of a cell with which the communication circuit is connected, and/or an external illumination measured by a sensor of the electronic device.

The estimating of the ambient temperature may include determining a current temperature that is increased by use of the electronic device based on the current consumption of the electronic device, where the ambient temperature is estimated as a value obtained by subtracting the current temperature from the internal temperature.

The adjusting of the heating control entry temperature may include increasing the heating control entry temperature, based on the estimated ambient temperature being higher than the internal temperature.

The adjusting of the heating control entry temperature may include decreasing the heating control entry temperature, based on the estimated ambient temperature being lower than the internal temperature.

According to an aspect of the disclosure, an electronic device may include a sensor configured to determine an internal temperature of the electronic device, a communication circuit, and a processor configured to iteratively learn a scenario in a temperature range, start the scenario, estimate an ambient temperature of the electronic device based on the internal temperature, an amount of change in the internal temperature during a specified time, and a current consumption of the electronic device, where the internal temperature, the amount of change, and the current consumption are included in the scenario, and change a time point for entering a heating control mode from a first time point to a second time point based on the estimated ambient temperature.

The processor may be further configured to set the second time point to be after the first time point, based on the estimated ambient temperature being higher than the internal temperature.

The processor may be further configured to set the second time point to be before the first time point, based on the estimated ambient temperature being lower than the internal temperature.

The scenario may include a plurality of sub-scenarios used by at least one or more of a plurality of components which generate heat in the electronic device.

The processor may be further configured to start the scenario, based on a GPS location, a Wi-Fi signal with which the communication circuit is connected, information of a cell with which the communication circuit is connected, and/or external illumination measured by the sensor being changed.

BRIEF DESCRIPTION OF DRAWINGS

The above and other aspects, features, and advantages of certain embodiments of the present disclosure will be more apparent from the following description taken in conjunction with the accompanying drawings, in which:

FIG. 5 is a diagram illustrating a scenario learned by an electronic device according to an embodiment;

DETAILED DESCRIPTION

Hereinafter, various embodiments of the disclosure may be described with reference to accompanying drawings. However, it should be understood that this is not intended to limit the disclosure to specific implementation forms and includes various modifications, equivalents, and/or alternatives of embodiments of the disclosure.

Figure 1:
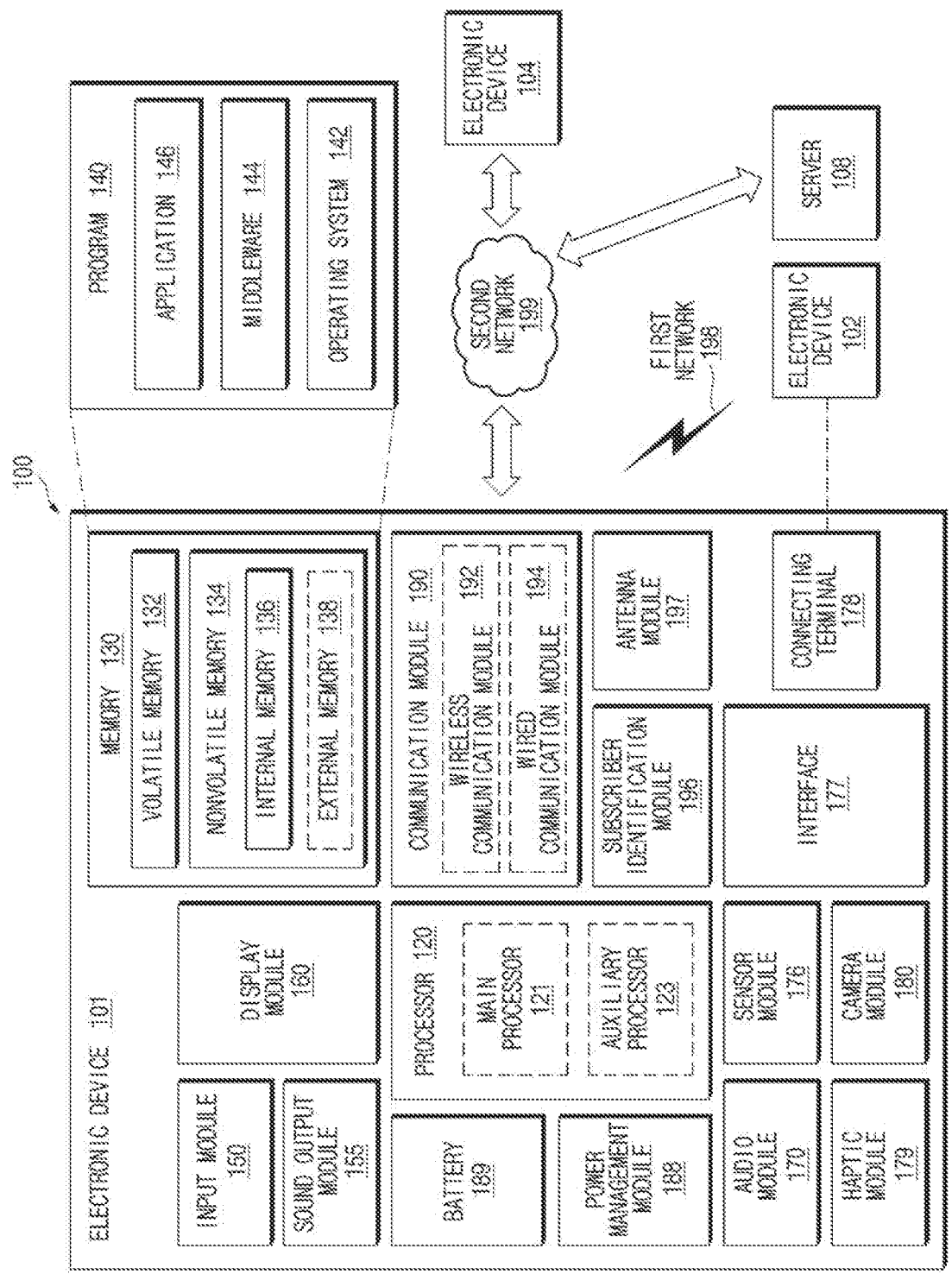
FIG. 1 is a diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
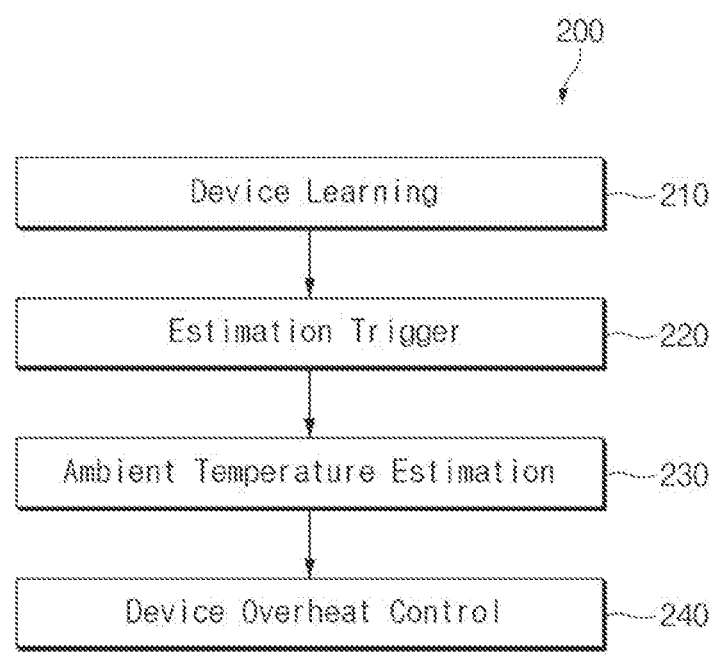
FIG. 2 is a flowchart illustrating a control method of an electronic device according to an embodiment.

FIG. 2 is a flowchart 200 illustrating a control method of an electronic device (e.g., an electronic device 101 of FIG. 1) according to an embodiment.

In operation 210, a processor (e.g., a processor 120 of FIG. 1) of the electronic device 101 according to an embodiment may perform device learning. The device learning may be an operation of learning internal information of the electronic device 101. The device learning may be machine learning.

In an embodiment, the processor 120 may set a scenario according to the use of the electronic device 101. The scenario may include a plurality of sub-scenarios. The processor 120 may set a scenario used by components in the electronic device 101. The processor 120 may set a sub-scenario used by at least one of a plurality of hardware modules, which may be a heating point and/or a hotspot in the electronic device 101. The processor 120 may set the plurality of sub-scenarios such that all the plurality of hardware modules are able to be used. The processor 120 may set a plurality of situations used by some of the plurality of hardware modules. The processor 120 may set each of the plurality of situations to a sub-scenario. The processor 120 may store the scenario in a memory (e.g., a memory 130 of FIG. 1).

In an embodiment, the processor 120 may execute the set scenario. The processor 120 may separately execute each of the plurality of sub-scenarios. The processor 120 may learn a state of the electronic device 101, which corresponds to the executed sub-scenario. The processor 120 may learn an internal temperature value of the electronic device 101 over time after executing the sub-scenario. The processor 120 may learn an amount of change in the internal temperature of the electronic device 101 during a specified time after executing the sub-scenario. The processor 120 may learn an amount of current consumed by the electronic device 101 after executing the sub-scenario. The processor 120 may learn an amount of charged current when charging the electronic device 101 after executing the sub-scenario.

In an embodiment, the processor 120 may execute a scenario in a specified first temperature range. The specified first temperature range may be a temperature range where the electronic device 101 is used. The specified first temperature range may be a room temperature range. For example, the specified first temperature range may be greater than or equal to about 15 degrees Celsius and may be less than or equal to about 45 degrees Celsius. The processor 120 may change a temperature while executing the scenario using a chamber capable of changing an ambient temperature of the electronic device 101. The processor 120 may change a temperature at a certain interval while executing the scenario. The processor 120 may iteratively learn the same sub-scenarios while changing the temperature.

In an embodiment, the processor 120 may iteratively learn sub-scenarios to obtain heating occurrence data associated with heating of the electronic device 101. The processor 120 may model machine learning using the heating occurrence data. The processor 120 may extract machine learning parameters. The processor 120 may store values of the machine learning parameters in the memory 130.

In an embodiment, the processor 120 may update a machine learning model. The processor 120 may iteratively learn sub-scenarios to improve the accuracy of the machine learning model. The processor 120 may differently set machine learning parameters for each electronic device 101. The processor 120 may differently set the machine learning parameters for each version of the machine learning model. The processor 120 may store the updated machine learning model in a server (e.g., a server 108 of FIG. 1) using a communication circuit (e.g., a wireless communication module 192 of FIG. 1). The processor 120 may download machine learning parameters from the server 108 using the communication circuit 192. The processor 120 may update the machine learning model using the downloaded machine learning parameters.

In operation 220, the processor 120 of the electronic device 101 according to an embodiment may perform an estimation trigger for starting a scenario. The processor 120 may set an event which starts the learned scenario.

In an embodiment, when the set event occurs, the processor 120 may start the learned scenario. In an embodiment, the processor 120 may perform a trigger for starting the learned scenario when the set event occurs.

In an embodiment, the processor 120 may set the case where a place element is changed to an event for starting the learned scenario. The place element may be data associated with a place where the electronic device 101 is located. For example, the place element may be data indicating whether the electronic device 101 is located in the exterior or interior. For another example, the place element may be data indicating whether the electronic device 101 is in a state where it is in the same place or a state where it moves to another place.

In an embodiment, when the electronic device 101 is located in the same place, an ambient temperature of the electronic device 101 may be maintained. When the electronic device 101 is located in the same place, while time elapses after the value of the ambient temperature is determined, the value of the ambient temperature of the electronic device 101 may change to a specified range or less. The processor 120 does not need to periodically perform the learned scenario. The processor 120 may determine a location and/or a situation of the electronic device 101 and may perform the learned scenario only if necessary. The processor 120 may decrease a resource required according to performing the learned scenario.

In operation 230, the processor 120 of the electronic device 101 according to an embodiment may perform ambient temperature estimation. The processor 120 may estimate an ambient temperature of the electronic device 101 based on the information learned with machine learning.

In an embodiment, when receiving a situation such as an outdoor air temperature estimation time point, the processor 120 may collect pieces of internal information in real time in the electronic device 101 based on machine learning parameters learned and stored in the memory 130. The pieces of internal information may include an internal temperature of the electronic device 101, an amount of change in the internal temperature of the electronic device 101 during a specified time, and a current consumption value of the electronic device 101.

In an embodiment, the processor 120 may use the pieces of collected internal information as an input of the machine learning model. The processor 120 may calculate an ambient temperature estimation value of the electronic device 101 based on the machine learning model.

In operation 240, the processor 120 of the electronic device 101 according to an embodiment may perform device overheat control. The processor 120 may use the estimated ambient temperature of the electronic device 101 as an input of heading control. The processor 120 may reflect the ambient temperature of the electronic device 101 when entering a heating control mode for reducing performance to prevent overheat due to the heating of the electronic device 101.

In an embodiment, the processor 120 may perform the device overheat control by using a surface temperature of the learned electronic device 101, which is learned by use of at least one thermistor included in a sensor module (e.g., a sensor module 176 of FIG. 1) of the electronic device 101, and the estimated ambient temperature together. The processor 120 may adjust performance of at least one of components in which heating occurs in the electronic device 101 and may enter the heating control mode. For example, the processor 120 may perform long term evolution (LTE) fallback where the communication circuit (e.g., the wireless communication module 192 of FIG. 1) switches a communication scheme from a 5G scheme to an LTE scheme and may enter the heating control mode. As another example, the processor 120 may decrease a luminance of a display (e.g., a display module 160 of FIG. 1) and may enter the heating control mode. The processor 120 may enter the heating control mode to decrease a surface temperature of the electronic device 101.

Figure 3:
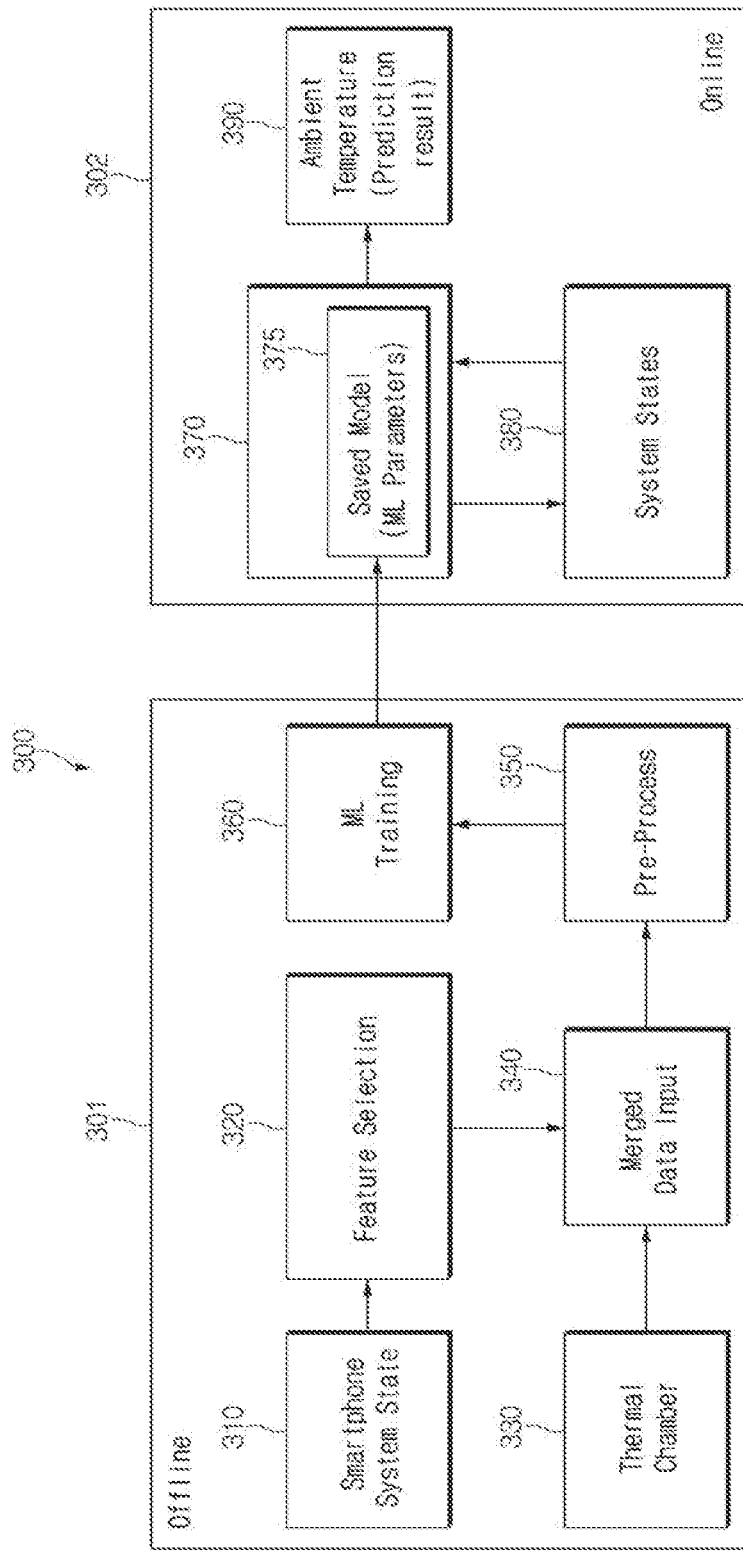
FIG. 3 is a diagram illustrating a scenario learning operation and an ambient temperature estimation operation of an electronic device according to an embodiment.

FIG. 3 is a diagram 300 illustrating a scenario learning operation and an ambient temperature estimation operation of an electronic device (e.g., an electronic device 101 of FIG. 1) according to an embodiment.

According to an embodiment, a processor (e.g., a processor 120 of FIG. 1) may operate include offline operations 301 and online operations 302. Device learning (e.g., device learning of operation 210 of FIG. 2) may be performed with offline operations 301. Ambient temperature estimation (e.g., ambient temperature estimation of operation 230 of FIG. 2) may be performed with online operations 302. Although offline operations 301 and online operations 302 are depicted, operations 301 and 302 may be performed by various offline/online configurations as will be understood by one of ordinary skill in the art from the disclosure herein.

In operation 310, the processor 120 according to an embodiment may obtain information associated with a system state of an electronic device (e.g., an electronic device 101 of FIG. 1). The processor 120 may set a scenario according to the use of the electronic device 101 based on the information associated with the system state of the electronic device 101.

In operation 320, the processor 120 according to an embodiment may select features for setting the scenario. The features may include machine learning parameters for learning the scenario. For example, the processor 120 may select the processor 120, a power management module (e.g., a power management module 188 of FIG. 1), a communication circuit (e.g., a wireless communication module 192 of FIG. 1), and/or a charging circuit of a battery (e.g., a battery 189 of FIG. 1) as the features. As another example, the processor 120 may select an internal temperature, an amount of change in the internal temperature during a specified time, and/or a current consumption value as features.

According to various embodiments, in operation 330, the electronic device 101 may be put into a thermal chamber. The processor 120 may change an ambient temperature of the electronic device 101 while the temperature of the thermal chamber is changed.

In operation 340, the processor 120 according to an embodiment may receive merged data. The processor 120 may receive a temperature of the thermal chamber, which is a learning environment, and pieces of internal information of the electronic device 101. The processor 120 may iteratively learn the pieces of received information. The processor 120 may separately collect pieces of information according to each ambient temperature.

In operation 350, the processor 120 according to an embodiment may perform a pre-process. For example, the processor 120 may store the pieces of received information in a memory (e.g., a memory 130 of FIG. 1). For another example, the processor 120 may transmit the pieces of received information to a server (e.g., a server 108 of FIG. 1) through a communication circuit (e.g., a wireless communication module 192 of FIG. 1).

In operation 360, the processor 120 according to an embodiment may perform machine learning (ML) training. The processor 120 may perform machine learning using pieces of information collected for each ambient temperature. The processor 120 may perform the ML to generate or update ML parameters. For example, linear regression (LR), supported vector regression (SVR), and/or multi-layer perception (MLP) may be applied to a ML model. However, it is not limited thereto. The processor 120 may perform the ML using various modeling schemes.

In operation 370, the processor 120 according to an embodiment may save the ML model. The saved model 375 may include ML parameters. The generated ML parameters may be included in software (e.g., a program 140 of FIG. 1) in the terminal.

In operation 380, the processor 120 according to an embodiment may select system states for estimating an ambient temperature of the electronic device 101. The system states may include parameters for estimating the ambient temperature. For example, the processor 120 may select the processor 120, the power management module 188, the communication circuit 192, and/or the charging circuit of the battery 189 as features. As another example, the processor 120 may select an internal temperature, an amount of change in the internal temperature during a specified time, and/or a current consumption value as features.

In operation 390, the processor 120 according to an embodiment may estimate an ambient temperature of the electronic device 101. The processor 120 may apply the selected parameters to calculate an ambient temperature estimation value of the electronic device 101.

In an embodiment, modeling may be performed, including at least one assumption for estimation to estimate the ambient temperature of the electronic device 101. For example, the at least one assumption may include the assumption that the internal temperature of the electronic device 101 is substantially the same as the temperature of the battery 189 of the electronic device 101. For another example, the at least one assumption may include the assumption that the temperature of the battery 189 of the electronic device 101 is determined by an influence of the ambient temperature and an influence by an internal operation of the electronic device 101. In detail, the at least one assumption may include the assumption that a temperature value Tbat of the battery 189 of the electronic device 101 is substantially the same as a value obtained by adding a temperature value $\Delta T$ increased by the operation of the electronic device 101 to an ambient temperature value Tamb of the electronic device 101 (refer to Equation (1) below for further explanation regarding values Tbat, Tamb, $\Delta T$, etc.).

In an embodiment, the temperature value $\Delta T$ increased by the operation of the electronic device 101 may be determined by the degree of use of components included in the electronic device 101. The temperature value $\Delta T$ increased by the operation of the electronic device 101 may be determined by the degree of use of circuits and ICs, which are hotspots which generate heat. The temperature value $\Delta T$ increased by the operation of the electronic device 101 may be estimated as current consumption of the electronic device 101.

In an embodiment, input values of the model for estimating the ambient temperature may include an internal temperature of the electronic device 101, an amount of change in the internal temperature of the electronic device 101 during a specified time, and current consumption of the electronic device 101.

In an embodiment, the internal temperature of the electronic device 101 may be a temperature value measured by at least one thermistor disposed in the electronic device 101. For example, the internal temperature of the electronic device 101 may be a temperature value of a processor (e.g., a processor 120 of FIG. 1) of the electronic device 101, a connecting terminal (e.g., a connecting terminal 178 of FIG. 1) (e.g., a USB), a battery (e.g., a battery 189 of FIG. 1), a charging circuit, the power management module 188, the wireless communication module 192 (e.g., CP and/or WiFi).

In an embodiment, the amount of change in the internal temperature of the electronic device 101 during the specified time may be obtained by measuring an amount of change in temperature of each thermistor per specified period. The current consumption of the electronic device 101 may be obtained by measuring an amount of current consumed by the power management module 188 (e.g., IFPMIC).

In an embodiment, the output value of the model for estimating the ambient temperature may be a temperature value $\Delta T$ increased by the operation of the electronic device 101.

In an embodiment, the ML model for estimating the ambient temperature may be generated by applying various ML methods. The ambient temperature may be calculated using the ML model. Various algorithms may be applied to a ML algorithm for calculating the temperature value $\Delta T$ increased by the operation of the electronic device 101.

In an embodiment, the ambient temperature value Tamb may be calculated as a value obtained by subtracting the temperature value $\Delta T$ increased by the operation of the electronic device 101 from a temperature value Tbat of the battery 189. When the temperature value $\Delta T$ increased by the operation of the electronic device 101 is calculated by use of the ML algorithm, the ambient temperature value Tamb may be calculated by subtracting the temperature value $\Delta T$ increased by the operation of the electronic device 101 from the temperature value Tbat of the battery 189.

In an embodiment, when the ambient temperature value Tamb is uniformly calculated, an estimation error may increase. When a specified condition is met, another scheme which calculates the ambient temperature value Tamb may be applied. For example, when the amount of current consumed by the IFPMIC is less than a specified first threshold and when a difference between temperature values of the processor 120 and the battery 189 is less than a specified second threshold, as the electronic device 101 is turned off or the electronic device 101 maintains a waiting state, it may be in a state in which there is substantially no change in temperature due to the operation of the electronic device 101. When the amount of current consumed by the IFPMIC is less than the specified first threshold and when a difference between temperature values of the processor 120 and the battery 189 is less than the specified second threshold, the ambient temperature value Tamb may be calculated as substantially the same value as the temperature value Tbat of the battery 189. When there is substantially no change in temperature due to the operation of the electronic device 101 as the electronic device 101 is turned off or the electronic device 101 maintains the waiting state, the processor 120 may determine that the ambient temperature value Tamb is substantially the same as the temperature value Tbat of the battery 189.

Figure 4:
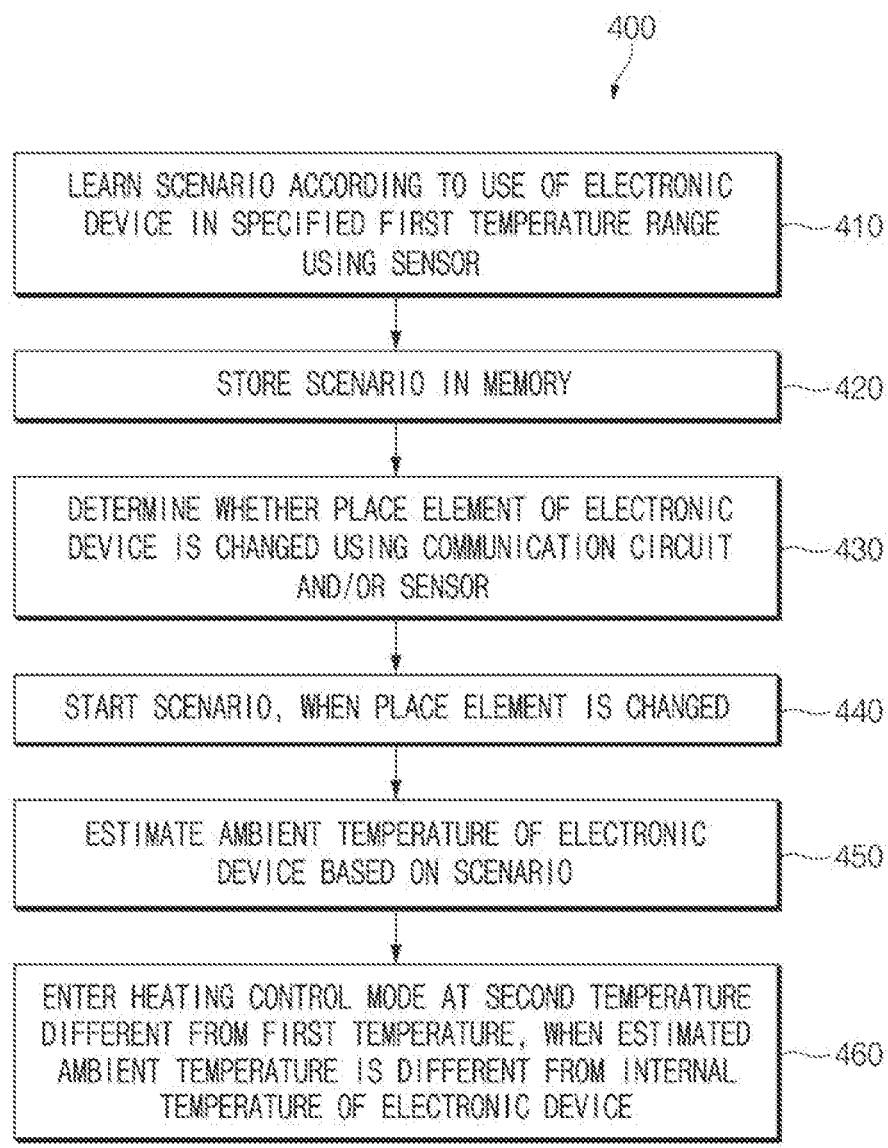
FIG. 4 is a flowchart illustrating a method for changing a temperature where an electronic device enters a heating control mode according to an embodiment.

FIG. 4 is a flowchart 400 illustrating a method for changing a temperature where an electronic device (e.g., an electronic device 101 of FIG. 1) enters a heating control mode according to an embodiment.

In operation 410, a processor (e.g., a processor 120 of FIG. 1) of the electronic device 101 according to an embodiment may learn a scenario according to the use of the electronic device 101 in a specified first temperature range using a sensor (e.g., a sensor module 176 of FIG. 1). The specified first temperature range may be a room temperature range. The scenario may include a plurality of sub-scenarios used by at least one or more of a plurality of components which generate heat in the electronic device 101. The learning may include acquisition of data associated with an internal temperature of the electronic device 101, an amount of change in internal temperature value during a specified time, current consumption of the electronic device 101, and/or a charging current when the electronic device 101 is charged. A communication circuit (e.g., a wireless communication module 192 of FIG. 1) of the electronic device 101 may download a plurality of ML parameters associated with the learning from a server (e.g., a server 108 of FIG. 1).

In operation 420, the processor 120 of the electronic device 101 according to an embodiment may store the scenario in a memory (e.g., a memory 130 of FIG. 1). The processor 120 may update the scenario using the plurality of ML parameters downloaded from the server 108.

In operation 430, the processor 120 of the electronic device 101 according to an embodiment may determine whether a place element of the electronic device 101 is changed using the communication circuit 192 and/or the sensor module 176. The place element may include a GPS location, a Wi-Fi signal with which the communication circuit 192 is connected, information of a cell with which the communication circuit 192 is connected, and/or external illumination measured by the sensor module 176. For example, when information of the Wi-Fi signal with which the communication circuit 192 is connected is changed or when the cell with which the communication circuit 192 is connected changes to another cell, the processor 120 may determine that the place element of the electronic device 101 is changed. As another example, when the amount of change in the external illumination measured by the sensor module 176 increases to a specified threshold or more, the processor 120 may determine that the location of the electronic device 101 changes from the interior to the exterior.

In operation 440, the processor 120 of the electronic device 101 according to an embodiment may start the scenario when the place element is changed. When the place element is changed, the processor 120 may determine that the ambient temperature of the electronic device 101 is able to be changed. When the place element is changed, the processor 120 may perform preparation for estimating the ambient temperature of the electronic device 101.

In operation 450, the processor 120 of the electronic device 101 according to an embodiment may estimate the ambient temperature of the electronic device 101 based on the scenario. The processor 120 may execute a corresponding sub-scenario among sub-scenarios included in the scenario to estimate the ambient temperature. The processor 120 may calculate a temperature increased by the operation of the electronic device 101 based on the current consumption of the electronic device 101. The processor 120 may estimate the ambient temperature as a value obtained by subtracting the temperature increased by the operation of the electronic device 101 from the internal temperature. When the current consumption of the electronic device 101 is less than or equal to a specified first threshold and when a difference between a temperature value of the processor 120 and a temperature value of a battery (or a battery 189 of FIG. 1) is less than or equal to a second threshold, the processor 120 may estimate that the ambient temperature is substantially the same as the internal temperature.

In operation 460, the processor 120 of the electronic device 101 according to an embodiment may be configured to enter a heating control mode at a second temperature different from a first temperature when the estimated ambient temperature is different from the internal temperature of the electronic device 101. When the estimated ambient temperature is higher than the internal temperature of the electronic device 101, the processor 120 may set the second temperature to a value higher than the first temperature. When the estimated ambient temperature is lower than the internal temperature of the electronic device 101, the processor 120 may set the second temperature to a value lower than the first temperature.

When the temperature for entering the heating control mode is maintained as the first temperature irrespective of the ambient temperature, a time point for entering the heating control mode may be faster or a period for operating in the heating control mode may be longer than hot regions close to the equator, for example, the Middle East and South Asia, or a region or season when maximum performance is not used or performance is relatively different in summer. For example, when a communication method of the communication circuit 192 is limited to enter the heating control mode in a tropical region, as fallback from 5G communication to LTE communication quickly operate, the 5G communication may not be almost used. For another example, a high brightness mode (HBM) should operate under direct sunlight outdoors and brightness should be increased to improve visibility. When the brightness of a display (e.g., a display module 160 of FIG. 1) is limited to enter the heating control mode, as the temperature of the electronic device 101 quickly increases due to an ambient temperature in summer, the electronic device 101 may fail to operate in the HBM.

When the estimated ambient temperature is higher than the internal temperature of the electronic device 101, the processor 120 of the electronic device 101 according to an embodiment may be configured to enter the heating control mode at the second temperature higher than the first temperature to ensure minimum performance of the electronic device 101 in an environment with a high ambient temperature. When the ambient temperature is high due to a region with a high temperature or an environmental factor, the processor 120 may operate in a normal mode to increase a temperature range for utilizing the electronic device 101 at maximum performance.

A user may better feel the heat generated by the electronic device 101 in a cold region or winter, and the sensory heating temperature may be relatively lowered. When the temperature for entering the heating control mode is maintained as the first temperature irrespective of the ambient temperature, after the user feels that a lot of heat is generated in the electronic device 101 in the cold region or winter, the electronic device 101 may enter the heating control mode. In this case, sensory heating felt by the user may increase.

When the estimated ambient temperature is lower than the internal temperature of the electronic device 101, the processor 120 of the electronic device 101 according to an embodiment may be configured to enter the heating control mode at the second temperature lower than the first temperature to decrease sensory heating felt by the user. The processor 120 may increase a temperature range for operating in the heating control mode to decrease heat due to the use of the electronic device 101 in the cold region or winter.

FIG. 5 is a diagram 500 illustrating a scenario learned by an electronic device (e.g., an electronic device 101 of FIG. 1) according to an embodiment.

In an embodiment, a processor 120 may learn a scenario according to the use of the electronic device 101. Types and the number of sub-scenarios included in the scenario may vary. The sub-scenarios may be set such that all of components or pieces of hardware in the electronic device 101, which are hotspots, operate in a single manner or in a complex manner. For example, the sub-scenarios may include all of the number of cases in which at least one of the components in the electronic device 101 operates.

In an embodiment, a plurality of sub-scenarios may be represented. For example, a first sub-scenario may be VT Call, the second sub-scenario may be VT Call+Download, the third sub-scenario may be Game1, a fourth sub-scenario may be Download, a fifth sub-scenario may be rapid discharge, a sixth sub-scenario may be camera recording, a seventh sub-scenario may be Youtube, an eighth sub-scenario may be Browsing, a ninth sub-scenario may be Game2, a tenth sub-scenario may be App Install+Download, an eleventh sub-scenario may be Benchmark Antutu, a twelfth sub-scenario may be Bnechmark geekbench4, and a thirteenth sub-scenario may be Benchmark GFX.

In an embodiment, hotspots used when performing each of the plurality of sub-scenarios may be different from each other. For example, the hotspots may include charging, Wi-Fi, and Flight. The charging hotspot may be used in the second sub-scenario, the third sub-scenario, the fourth sub-scenario, the seventh sub-scenario, the ninth sub-scenario, and the tenth sub-scenario. The Wi-Fi hotspot may be used in the fifth sub-scenario and the tenth sub-scenario. The Flight hotspot may be used in the eleventh sub-scenario, the twelfth sub-scenario, and the thirteenth sub-scenario.

In an embodiment, components used when performing each of the plurality of sub-scenarios may be different from each other. Combinations of the components used when performing each of the plurality of sub-scenarios may be different from each other. Heat generated by the electronic device 101 when performing each of the plurality of sub-scenarios may differ. The processor 120 may measure heat generated by the electronic device 101 when performing each of the plurality of sub-scenarios and may store related data in a memory (e.g., a memory 130 of FIG. 1).

Figure 6:
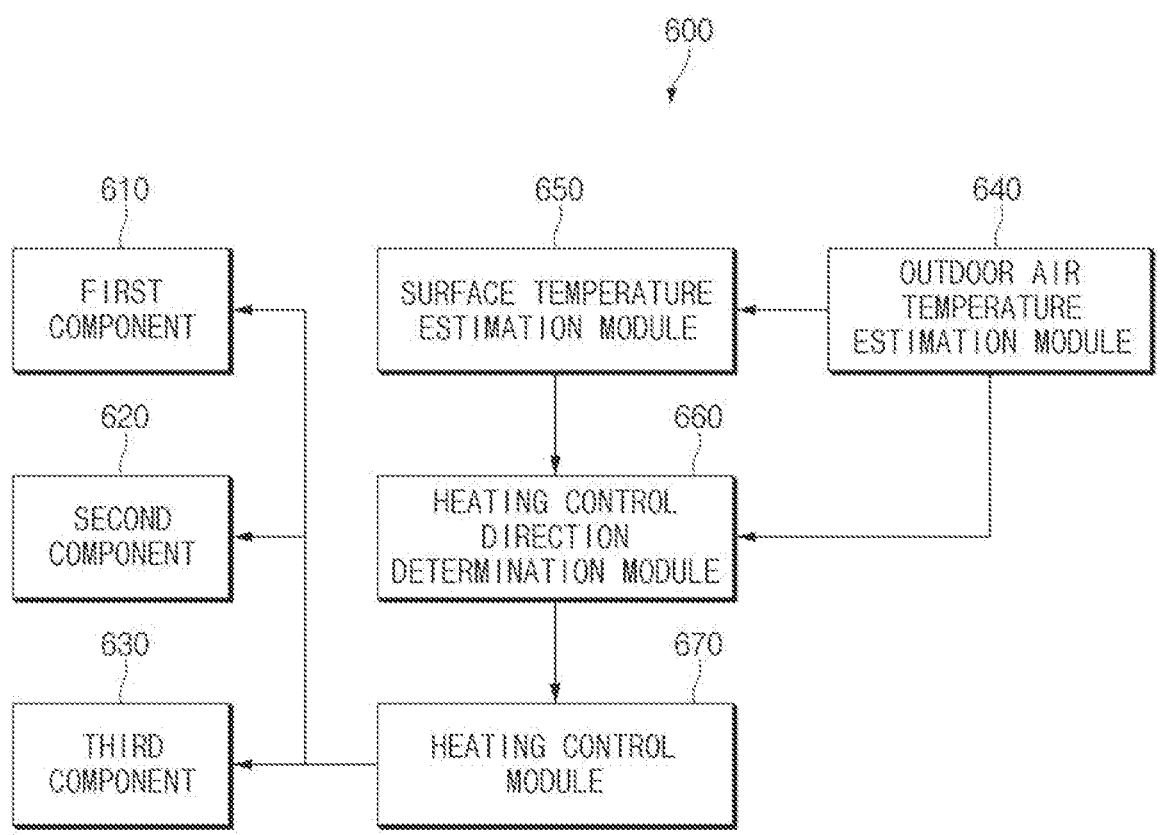
FIG. 6 is a diagram illustrating modules which enter a heating control mode from a general mode by an electronic device according to an embodiment.

FIG. 6 is a diagram 600 illustrating modules which enter a heating control mode from a general mode by an electronic device (e.g., an electronic device 101 of FIG. 1) according to an embodiment. A processor (e.g., a processor 120 of FIG. 1) of the electronic device 101 according to an embodiment may include an outdoor air temperature estimation module 640, a surface temperature estimation module 650, a heating control direction determination module 660, and a heating control module 670.

In an embodiment, the outdoor air temperature estimation module 640 may estimate an ambient temperature of the electronic device 101. The outdoor air temperature estimation module 640 may estimate the ambient temperature based on the learned scenario. The outdoor air temperature estimation module 640 may estimate the ambient temperature based on an internal temperature of the electronic device 101, an amount of change in the internal temperature during a specified time, and current consumption of the electronic device 101. The outdoor air temperature estimation module 640 may deliver the estimated ambient temperature to the heating control direction determination module 660.

In an embodiment, the surface temperature estimation module 650 may estimate a surface temperature of the electronic device 101. The internal temperature of the electronic device 101 may be measured using a thermistor included in a sensor module (e.g., a sensor module 176 of FIG. 1) of the electronic device 101. The surface temperature estimation module 650 may estimate the surface temperature based on the measured internal temperature. The surface temperature estimation module 650 may deliver the estimated surface temperature to the heating control direction determination module 660.

In an embodiment, the heating control direction determination module 660 may set a condition for entering the heating control mode.

In an embodiment, the heating control direction determination module 660 may set a temperature for entering the heating control mode from a normal mode. When the ambient temperature is high, because a temperature for feeling heating becomes also high, heating control may be suspended according to the ambient temperature.

In an embodiment, when the temperature for entering the heating control mode increases to greater than or equal to a threshold temperature infecting the electronic device 101, a low-temperature burn may occur. The heating control direction determination module 660 may set the temperature for entering the heating control mode to the threshold temperature or less.

In an embodiment, the heating control direction determination module 660 may determine a heating control direction depending on the ambient temperature. For example, when the temperature for entering the heating control mode before the ambient temperature is reflected (or currently set the temperature for entering the heating control mode) is A (e.g., A ° C.) and when the maximum temperature where it is able to suspend the heating control mode to prevent a low-temperature burn is B (e.g., B° C.), a temperature TCA for entering the heating control mode set based on the ambient temperature may be defined as Equation (1) below.

$$TCA = A + (B^*\alpha), \alpha = (TambMax - TambCurrent)/(TambMax - TambMin), \quad (1)$$

if TambMax<TambCurrent, then TambCurrent=TambMax where TambMax is a temperature having a maximum value among the ambient temperature determined during a predetermined time, TambMin is a temperature having a minimum value among the ambient temperature determined during the predetermined time, and TambCurrent is a current ambient temperature.

In an embodiment, the heating control direction determination module 660 may adjust a time point for entering the heating control mode from the normal mode. The heating control direction determination module 660 may dynamically increase or decrease a rate for operating in the heating control mode. The heating control direction determination module 660 may deliver the set condition to the heating control module 670.

In an embodiment, conversely, in a cold region or extremely low temperature, or in winter, the criteria for the surface temperature of the electronic device 101 to be sensed may be low. When the ambient temperature is less than or equal to a specific temperature, the heating control direction determination module 660 may apply the above-mentioned algorithm in reverse to set the temperature where the electronic device 101 enters the heating control mode to be low. The heating control direction determination module 660 may allow the electronic device 101 to more quickly enter the heating control mode to decrease heating felt by the user.

In an embodiment, the surface temperature of the electronic device 101 may be influenced by the ambient temperature. Thus, the outdoor air temperature estimation module 640 may deliver the ambient temperature to the surface temperature estimation module 650. The surface temperature estimation module 650 may receive the ambient temperature and may estimate a more accurate surface temperature.

In an embodiment, the heating control direction determination module 660 may monitor a change in the ambient temperature. The heating control direction determination module 660 may determine a space where the electronic device 101 is located is an open space or a closed space depending on a change speed of the ambient temperature. The heating control direction determination module 660 may determine a direction of heating control depending on the space where the electronic device 101 is located.

In an embodiment, the heating control module 670 may perform heating control depending on the direction determined by the heating control direction determination module 660. The heating control module 670 may allow a first component 610, a second component 620, and/or a third component 630 to enter the heating control mode.

Figure 7:
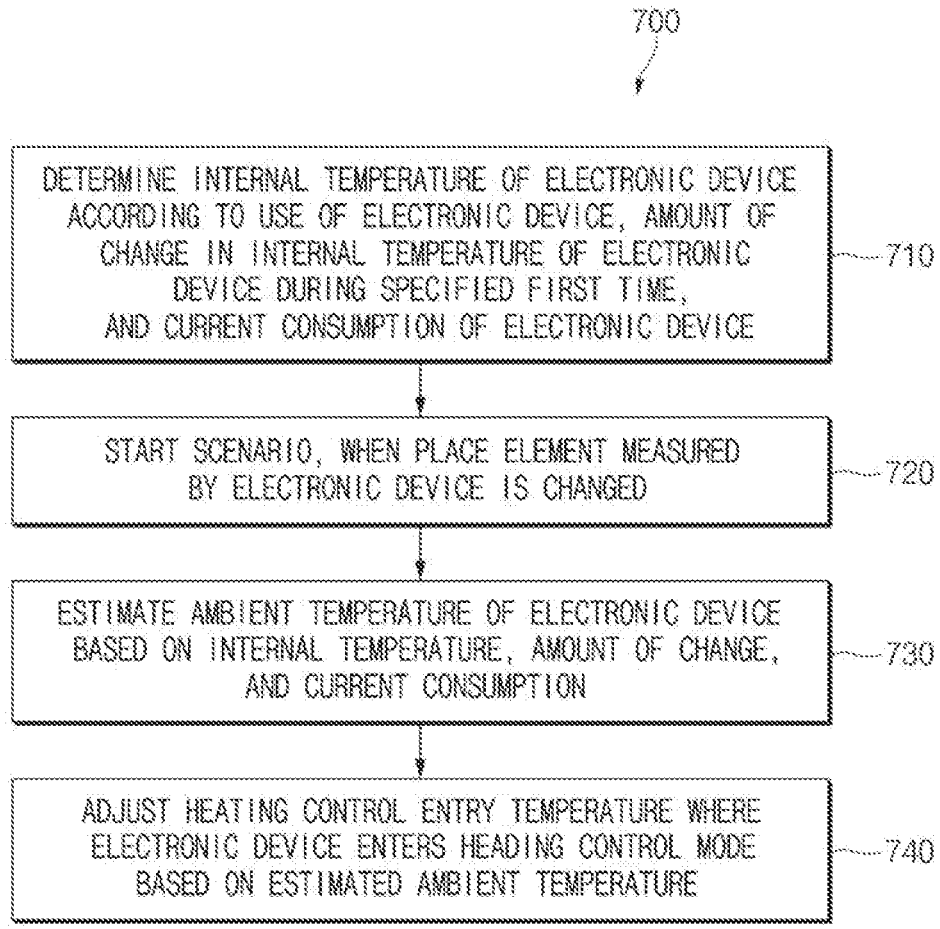
FIG. 7 is a flowchart illustrating a method for changing a temperature where an electronic device enters a heating control mode according to an embodiment.

FIG. 7 is a flowchart 700 illustrating a method for changing a temperature where an electronic device (e.g., an electronic device 101 of FIG. 1) enters a heating control mode according to an embodiment.

In operation 710, a processor (e.g., a processor 120 of FIG. 1) of the electronic device 101 according to an embodiment may determine an internal temperature of the electronic device 101 according to the use of the electronic device 101, an amount of change in the internal temperature of the electronic device 101 during a specified first time, and current consumption of the electronic device 101 and may learn a scenario. The scenario may include a plurality of sub-scenarios used by at least one or more of a plurality of components which generate heat in the electronic device 101. The processor 120 may iteratively obtain the scenario depending on the use of the electronic device 101 in a specified first temperature range.

In operation 720, the processor 120 of the electronic device 101 according to an embodiment may start the scenario when the place element measured by the electronic device 101 is changed. The place element may include a GPS location, a Wi-Fi signal with which a communication circuit (e.g., a wireless communication module 192 of FIG. 1) is connected, information of a cell with which the communication circuit 192 is connected, and/or external illumination measured by a sensor (e.g., a sensor module 176).

In an embodiment, the ambient temperature may fail to be quickly changed in the same space. Because the ambient temperature is gradually changed or is kept constant for a short time in the same space, ambient temperature estimation may fail to be periodically performed in the same space.

In an embodiment, the processor 120 may set an estimation time point using a place element such as information measured by the sensor module 176, information of WiFi, AP, or an RF network with which the communication circuit 192 is connected, or GPS information. For example, when the illumination measured by the sensor module 176 changes to a specified threshold or more, the place may change to an external environment with direct sunlight. The processor 120 may estimate and update an ambient temperature at a time point when the measured illumination changes to the specified threshold or more. For another example, when the Wi-Fi connection state of the communication circuit 192 is changed or when the connected AP is changed, the ambient temperature may vary as the place is changed. The processor 120 may estimate and update an ambient temperature at a time point when the Wi-Fi connection state of the communication circuit 192 is changed or when the connected AP is changed. For another example, the processor 120 may monitor GPS or network cell information to determine an ambient temperature estimation time point. The processor 120 may set an estimation time point using the place element and may decrease an internal load of the electronic device 101 for ambient temperature estimation.

In operation 730, the processor 120 of the electronic device 101 according to an embodiment may estimate an ambient temperature of the electronic device 101 based on an internal temperature, an amount of change, and current consumption. The processor 120 may calculate a temperature increased by the operation of the electronic device 101, based on the current consumption of the electronic device 101. The processor 120 may estimate the ambient temperature as a value obtained by subtracting the temperature increased by the operation of the electronic device 101 from the internal temperature.

In operation 740, the processor 120 of the electronic device 101 according to an embodiment may adjust a heating control entry temperature where the electronic device 101 enters a heating control mode based on the estimated ambient temperature. When the estimated ambient temperature is higher than the internal temperature of the electronic device 101, the processor 120 may increase the heating control entry temperature. When the estimated ambient temperature is lower than the internal temperature of the electronic device 101, the processor 120 may decrease the heating control entry temperature.

Figure 8:
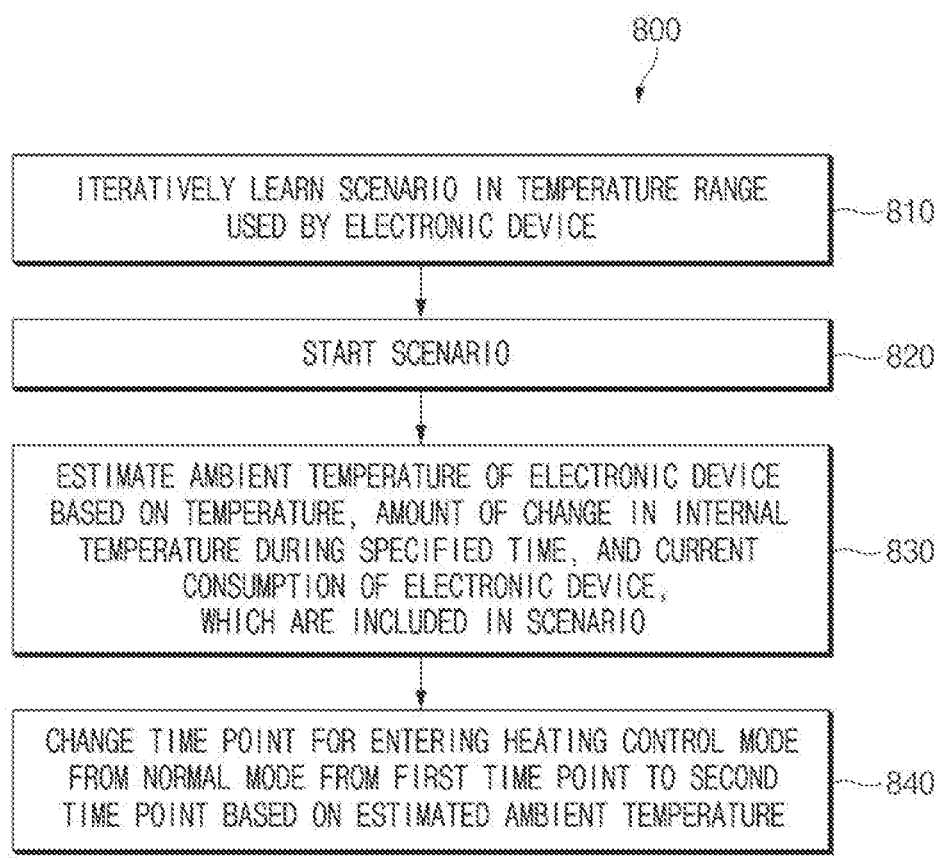
FIG. 8 is a flowchart illustrating a method for changing a time point where the electronic device enters a heating control mode according to an embodiment.

FIG. 8 is a flowchart 800 illustrating a method for changing a time point where an electronic device (e.g., an electronic device 101 of FIG. 1) enters a heating control mode according to an embodiment.

In operation 810, a processor (e.g., a processor 120 of FIG. 1) of the electronic device 101 according to an embodiment may iteratively learn a scenario in a temperature range used by the electronic device 101. The scenario may include a plurality of sub-scenarios used by at least one or more of a plurality of components which generate heat in the electronic device 101.

In operation 820, the processor 120 of the electronic device 101 according to an embodiment may start the scenario. The processor 120 may be configured to start the scenario when a GPS location, a Wi-Fi signal with which a communication circuit (e.g., a wireless communication module 192 of FIG. 1) is connected, information of a cell with which the communication circuit 192 is connected, and/or external illumination measured by a sensor (e.g., a sensor module 176 of FIG. 1) are/is changed.

In operation 830, the processor 120 of the electronic device 101 according to an embodiment may estimate an ambient temperature of the electronic device 101 based on an internal temperature, an amount of change in the internal temperature during a specified time, and current consumption of the electronic device 101, which are included in the scenario.

In operation 840, the processor 120 of the electronic device 101 according to an embodiment may change a time point for entering the heating control mode from a normal mode from a first time point to a second time point based on the estimated ambient temperature. When the estimated ambient temperature is higher than the internal temperature, the processor 120 may be configured to set the second time point to be after the first time point. When the estimated ambient temperature is lower than the internal temperature, the processor 120 may be configured to set the second time point to be before the first time point.

According to embodiments of the disclosure, an ambient temperature of an electronic device may be estimated, and a heating control entry temperature may be controlled based on the estimated ambient temperature. Thus, when the ambient temperature of the electronic device has a value out of a room temperature range, a time point for entering a heating control mode may be actively adjusted.

Furthermore, according to embodiments of the disclosure, when the ambient temperature of the electronic device is higher than the room temperature range, the heating control entry temperature may be raised. Thus, when the ambient temperature of the electronic device is higher than the room temperature range, components in the electronic device may more easily operate in a normal mode.

Furthermore, according to embodiments of the disclosure, when the ambient temperature of the electronic device is lower than the room temperature range, the heating control entry temperature may be lowered. Thus, when the ambient temperature of the electronic device is lower than the room temperature range, inconvenience due to heat generated by the electronic device may be reduced.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
a sensor;
a communication circuit; and
a processor is configured to:
   learn a scenario based on use of the electronic device in a first temperature range;
      determine, using at least one of the communication circuit and the sensor, whether a place element of the electronic device is changed;
   start the scenario based on determining that the place element is changed;
   estimate an ambient temperature of the electronic device based on the scenario; and
   enter a second heating control mode at a second temperature different from a first heating control mode at a first temperature, based on the estimated ambient temperature being different from an internal temperature of the electronic device.

2. The electronic device of claim 1, wherein the scenario comprises a plurality of sub-scenarios used by at least one of a plurality of components which generate heat in the electronic device.

3. The electronic device of claim 1, wherein the processor is further configured to learn the scenario by acquiring at least one of data associated with the internal temperature of the electronic device, data associated with an amount of change in the internal temperature during a specified time, data associated with a current consumption of the electronic device, and data associated with a charging current when the electronic device is charged.

4. The electronic device of claim 1, wherein the communication circuit is configured to obtain a plurality of machine learning parameters from a server, and
   wherein the processor is further configured to update the scenario based on the plurality of machine learning parameters.

5. The electronic device of claim 1, wherein the place element comprises at least one of a global positioning system (GPS) location, a Wi-Fi signal with which the communication circuit is connected, information of a cell with which the communication circuit is connected, and an external illumination measured by the sensor.

6. The electronic device of claim 1, wherein the processor is further configured to:
   determine a current temperature that is increased by use of the electronic device based on a current consumption of the electronic device; and
   wherein the processor is configured to estimate the ambient temperature based on a value obtained by subtracting the current temperature from the internal temperature.

7. The electronic device of claim 1, wherein the processor is further configured to, based on the estimated ambient temperature being higher than the internal temperature, set the second temperature to a value higher than the first temperature.

8. The electronic device of claim 1, wherein the processor is further configured to, based on the estimated ambient temperature being lower than the internal temperature, set the second temperature to a value lower than the first temperature.

9. A method of an electronic device, the method comprising:
   determining an internal temperature of the electronic device based on use of the electronic device;

determining an amount of change in the internal temperature of the electronic device during a specified first time;

determining a current consumption of the electronic device;

learning a scenario;

starting the scenario, based on a place element measured by the electronic device being changed;

estimating an ambient temperature of the electronic device based on the internal temperature, the amount of change, and the current consumption; and adjusting a heating control entry temperature at which the electronic device enters a heating control mode based on the estimated ambient temperature.

10. The method of claim 9, wherein the scenario comprises a plurality of sub-scenarios used by at least one of a plurality of components which generate heat in the electronic device.

11. The method of claim 9, further comprising iteratively obtaining the scenario based on use of the electronic device in a first temperature range.

12. The method of claim 9, wherein the place element comprises at least one of a global positioning system (GPS) location, a Wi-Fi signal with which a communication circuit of the electronic device is connected, information of a cell with which the communication circuit is connected, and an external illumination measured by a sensor of the electronic device.

13. The method of claim 9, wherein the estimating of the ambient temperature comprises:

determining a current temperature that is increased by use of the electronic device based on the current consumption of the electronic device; and wherein the ambient temperature is estimated as a value obtained by subtracting the current temperature from the internal temperature.

14. The method of claim 9, wherein the adjusting the heating control entry temperature comprises:

based on the estimated ambient temperature being higher than the internal temperature, increasing the heating control entry temperature.

15. The method of claim 14, wherein the adjusting of the heating control entry temperature comprises:

based on the estimated ambient temperature being lower than the internal temperature, decreasing the heating control entry temperature.

16. An electronic device comprising:

a sensor configured to determine an internal temperature of the electronic device;

a communication circuit; and a processor configured to:

iteratively learn a scenario in a temperature range used by the electronic device;

start the scenario;

estimate an ambient temperature of the electronic device based on the internal temperature, an amount of change in the internal temperature during a specified time, and a current consumption of the electronic device, wherein the internal temperature, the amount of change, and the current consumption are included in the scenario; and change a time point for entering a heating control mode from a first time point to a second time point based on the estimated ambient temperature.

17. The electronic device of claim 16, wherein the processor is further configured to:

based on the estimated ambient temperature being higher than the internal temperature, set the second time point to be after the first time point.

18. The electronic device of claim 16, wherein the processor is further configured to:

based on the estimated ambient temperature being lower than the internal temperature, set the second time point to be before the first time point.

19. The electronic device of claim 16, wherein the scenario comprises a plurality of sub-scenarios used by at least one of a plurality of components which generate heat in the electronic device.

20. The electronic device of claim 16, wherein the processor is further configured to:

start the scenario, based on at least one of a global positioning system (GPS) location, a Wi-Fi signal with which the communication circuit is connected, information of a cell with which the communication circuit is connected, and external illumination measured by the sensor being changed.

* * * * *